(12) United States Patent
Berger et al.

(10) Patent No.: US 11,717,835 B2
(45) Date of Patent: Aug. 8, 2023

(54) FOOD WASTE DISPOSER MONITORING USING PHASE DIFFERENCE BETWEEN MOTOR VOLTAGE AND MOTOR CURRENT

(71) Applicant: InSinkErator LLC, Benton Harbor, MI (US)

(72) Inventors: Thomas R. Berger, Peoria, AZ (US); Charles A. Farago, Kenosha, WI (US); Ronnie A. Wunderlich, Endicott, NY (US); Gregory L. Cleveland, Owego, NY (US); Alan S. Rohulich, Endwell, NY (US)

(73) Assignee: InSinkErator LLC, Benton Harbor, MI (US)

( * ) Notice: Subject to any disclaimer, the term of this patent is extended or adjusted under 35 U.S.C. 154(b) by 86 days.

(21) Appl. No.: 17/512,096

(22) Filed: Oct. 27, 2021

(65) Prior Publication Data

US 2022/0048038 A1  Feb. 17, 2022

Related U.S. Application Data

(63) Continuation of application No. 16/673,921, filed on Nov. 4, 2019, now Pat. No. 11,161,123.

(60) Provisional application No. 62/773,508, filed on Nov. 30, 2018.

(51) Int. Cl.
*B02C 25/00* (2006.01)
*B02C 18/00* (2006.01)
*E03C 1/266* (2006.01)
*G01R 25/00* (2006.01)

(52) U.S. Cl.
CPC .......... *B02C 25/00* (2013.01); *B02C 18/0092* (2013.01); *E03C 1/2665* (2013.01); *G01R 25/005* (2013.01)

(58) Field of Classification Search
CPC ..... B02C 25/00; B02C 18/0092; B02C 18/24; B02C 23/04; B02C 23/36; E03C 1/2665
See application file for complete search history.

(56) References Cited

U.S. PATENT DOCUMENTS

| 5,308,000 | A | 5/1994 | Riley |
| 5,808,441 | A | 9/1998 | Nehring |
| 7,066,415 | B2 | 6/2006 | Strutz |
| 7,971,810 | B2 | 7/2011 | Hirsch et al. |
| 8,382,019 | B2 | 2/2013 | Romanovich et al. |
| 2003/0029947 | A1 | 2/2003 | Strutz et al. |
| 2004/0251339 | A1 | 12/2004 | Strutz |
| 2006/0011526 | A1 | 1/2006 | Baarman et al. |
| 2008/0067270 | A1 | 3/2008 | Strutz |
| 2015/0202633 | A1 | 7/2015 | Perkins |

FOREIGN PATENT DOCUMENTS

| CN | 101050640 A | 10/2007 |
| CN | 101451367 A | 6/2009 |
| CN | 202137022 U | 2/2012 |
| CN | 202570293 U | 12/2012 |
| CN | 203846580 U | 9/2014 |
| CN | 105435917 A | 3/2016 |
| CN | 106714972 A | 5/2017 |

(Continued)

*Primary Examiner* — Faye Francis
(74) *Attorney, Agent, or Firm* — Harness, Dickey & Pierce, P.L.C.

(57) ABSTRACT

A control unit for a food waste disposer has a controller that determines operational status of the food waste disposer based on motor loading of an induction motor of the food waste disposer.

16 Claims, 5 Drawing Sheets

(56) References Cited

FOREIGN PATENT DOCUMENTS

| | | | |
|---|---|---|---|
| FR | 2749714 | A1 | 12/1997 |
| JP | 2002292301 | A | 10/2002 |
| JP | 2002355571 | A | 12/2002 |

FOOD WASTE DISPOSER MONITORING USING PHASE DIFFERENCE BETWEEN MOTOR VOLTAGE AND MOTOR CURRENT

CROSS-REFERENCE TO RELATED APPLICATIONS

This application is a continuation of U.S. patent application Ser. No. 16/673,921, filed Nov. 4, 2019, to issue as U.S. Pat. No. 11,161,123 on Nov. 2, 2021, which claims the benefit of U.S. Provisional Application No. 62/773,508 filed Nov. 30, 2018. The entire disclosure of the above applications are incorporated herein by reference.

FIELD

The present disclosure relates generally to food waste disposers, and more particularly, to monitoring food waste disposer operation by sensing motor load of an induction motor of a food waste disposer.

BACKGROUND

This section provides background information related to the present disclosure, which is not necessarily prior art.

A food waste disposer of the type that is disposed underneath a sink and is mounted to a drain opening of the sink typically includes a food conveying section, a motor section and a grind section. The grind section is disposed between the food conveying section and the motor section. The food conveying section conveys food waste and water to the grind section. The grind section receives and grinds the food waste and the ground food waste is discharged through a discharge opening to a tailpipe.

The grind section typically includes a grind mechanism with a rotating shredder plate assembly and a stationary grind ring. The shredder plate assembly is connected to a shaft of an electric motor of the motor section and includes a shredder plate with one or more lugs, typically one or more pairs of lugs. The lugs may include fixed lugs that are fixed to the shredder plate, rotatable lugs (also called swivel lugs) that are rotatably fastened to the shredder plate and are free to rotate thereon, or both. The shredder plate is rotated relative to the grind ring via the electric motor. The grind ring is typically mounted in housing and includes multiple spaced teeth and/or windows.

During operation of the food waste disposer, the food waste that is directed from the food conveying section to the grind section is forced by the lugs against the grind ring to comminute the food waste. When the food waste is sufficiently ground, the food waste passes through gaps between the shredder plate and the grind ring and enters a discharge area in an upper end bell as a food waste/water slurry. It is then discharged out a discharge outlet in the upper end bell through a tail pipe to a drain line of household plumbing.

Figure 1:
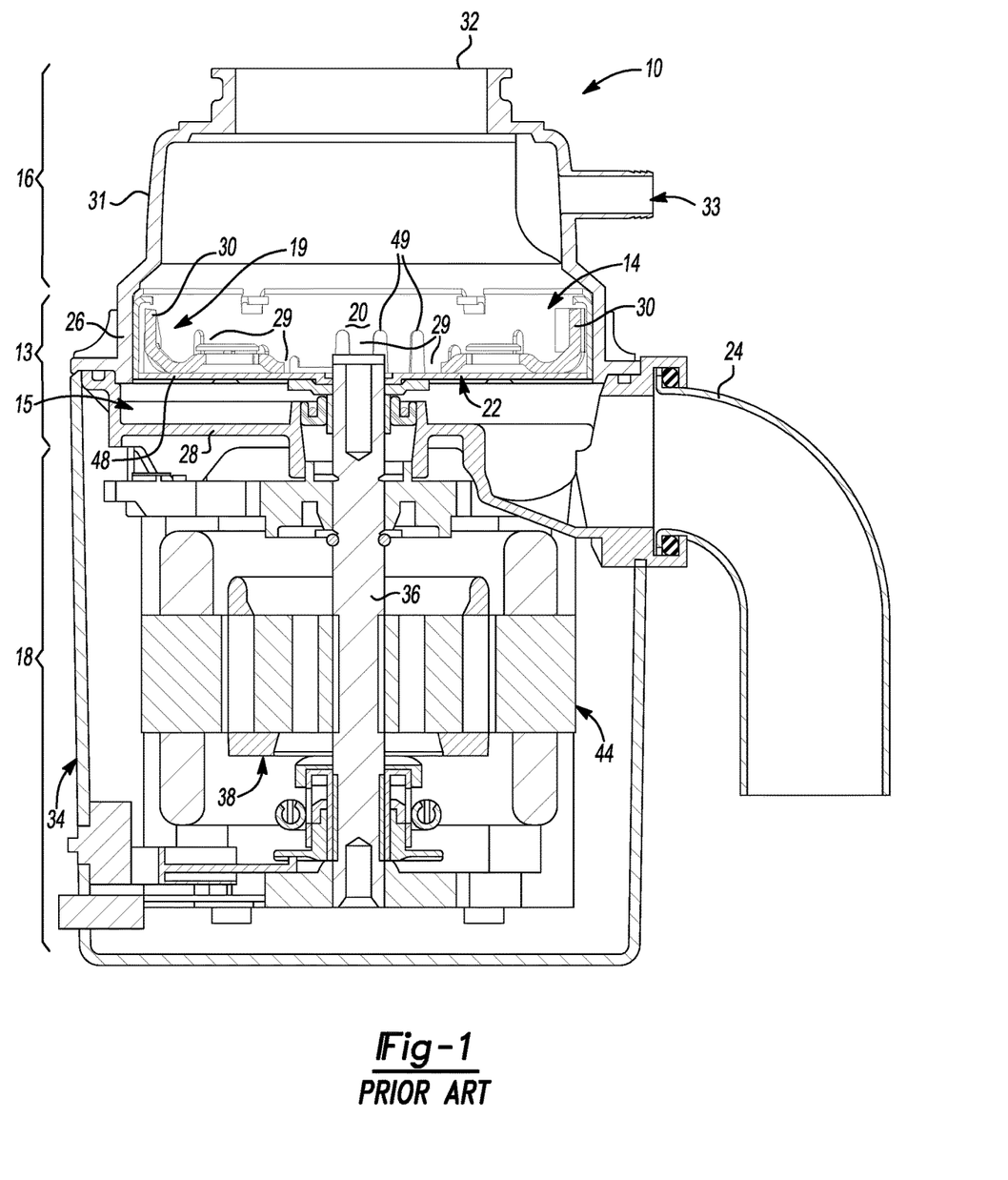
FIG. 1 is a sectional view of an example of a prior art food waste disposer.

FIG. 1 shows an example of a prior art food waste disposer 10. The food waste disposer 10 includes a grind and discharge section 13 disposed between a food conveying section 16 and a motor section 18. The grind and discharge section 13 includes a grind section 14 and a discharge section 15. The grind section 14 includes a grind mechanism 19 with a stationary grind ring 20 and a rotatable shredder plate assembly 22. The rotatable shredder plate assembly 22 includes a rotatable shredder plate 48 on which swivel lugs 30 are rotatably fastened. In some cases, the rotatable shredder plate 48 has fixed lugs instead of swivel lugs and in some cases has both swivel lugs and fixed lugs.

The grind section 14 includes a grind housing 26 that encompasses the grind mechanism 19. The grind housing 26 may be fastened to an upper end bell (UEB) 28 of the discharge section 15 and holds the stationary grind ring 20. The stationary grind ring 20 is mounted in a fixed (stationary) position within the grind housing 26. The stationary grind ring 20 includes teeth 29. The stationary grind ring 20 may be fixedly affixed to an inner surface of the grind housing 26 by an interference fit and may be composed, for example, of galvanized steel.

The food conveying section 16 includes an inlet housing 31 with a first inlet 32. The first inlet 32 receives food waste and water. The inlet housing 31 may be a metal housing or an injection molded plastic housing. The inlet housing 31 also includes a second inlet 33 for receiving water discharged from a dishwasher (not shown). The inlet housing 31 may be integrally formed with the grind housing 26, such as by injection-molding both of the housings 26, 31 as a single component.

The motor section 18 includes a motor 34 having a rotor 38 and a stator 44. Rotor 38 rotates in stator 44 imparting rotational movement to a rotor shaft 36 of a rotor 38. Motor 34 may be an induction motor, but may be other types of motors. The rotor shaft 36 is connected to and rotates the rotatable shredder plate assembly 22 within the stationary grind ring 20.

During operation of the food waste disposer 10, the rotatable shredder plate assembly 22 is rotated by motor 34. Due to the rotation of the rotatable shredder plate assembly 22, lugs 30 force the food waste against the teeth 29 of grind ring 20 to grind the food waste into small particulate matter. A slurry of the particulate matter and water passes from the rotatable shredder plate assembly 22, outside a periphery of rotatable shredder plate 48, through gaps 49 between the teeth 29 to a discharge area below the rotatable shredder plate assembly 22 and in the UEB 28. It is then discharged out a discharge outlet of UEB 28 through tailpipe 24 to a drain line (not shown).

A means of being able to tell if a food waste disposer is running, grinding, jammed or a thermal overload has tripped is valuable to the consumer, to the manufacturer and to retailers. Sometimes food waste disposers are returned to the retailer or to the manufacturer under warranty because the thermal overload tripped, and the trip is not obvious to the user or the method of resetting the overload is sometimes not known by the consumer. With some food waste disposers, the grinding system is so quiet it can be difficult to tell if food waste grinding is complete or if the disposer is still running. As a result, the food waste disposer is sometimes left running, eventually tripping the thermal overload on the food waste disposer.

One way to determine the status of operation of a food waste disposer is to sense loading of the motor of the food waste disposer and determine the status of operation of the food waste disposer based on the sensed motor loading. The status of operation of the food waste disposer is for example whether the food waste disposer is running, grinding, jammed or that its thermal overload has tripped. The status can then be reported to the consumer.

While one way of sensing motor loading is sensing the magnitude of current that the motor is drawing, this approach doesn't work that well for induction motors as the magnitude of current being drawn by an induction motor doesn't change that much under different loads. Induction motors are high in inductance which results in a high reactive current. The load on the motor such as grinding results in a non-reactive current or real current. The real current is typically much less than the reactive current. Therefore the total current (magnitude of reactive+real) does not significantly vary with the real current. It's thus difficult to use the magnitude of current drawn by an induction motor to determine if the food waste disposer grind cycle is complete, especially under a running water load and across different horsepower motors. This has been an issue since the advent of the induction motor. In some cases, voltage drop on the input voltage line to the motor is used as a means of determining induction motor loading. This approach is not that accurate and also requires additional hardware and software filtering given the level of noise that could be present on the motor input voltage.

It is therefore desirable to be able to accurately sense motor load of an induction motor of a food waste disposer.

SUMMARY

In accordance with an aspect of the present disclosure, a control unit for a food waste disposer and a method of monitoring operation of the food waste disposer with the control unit is provided. The food waste disposer has a food conveying section, a motor section in which an induction motor is disposed and that rotates a rotatable shredder plate of a grind and discharge section. The motor is powered by alternating current electrical power from a source of alternating current electrical power to which the control unit is coupled. The control unit is configured to turn the electrical power to the food waste disposer on and off. The alternating current electrical power has a line frequency, a line voltage and a line current. The control unit has a controller configured to read phase shifts between the line current and line voltage of every half cycle of the line frequency. When the motor of the food waste disposer is running and after expiration of a start-up period, the controller is configured to determine that the food waste disposer is grinding when each of a first predetermined number of consecutively read phase shifts that were most recently read is less than a grind check phase shift threshold.

In accordance with an aspect, the status of operation includes whether the food waste disposer has finished grinding and the controller is further configured to determine that the food waste disposer has finished grinding when no phase shift reading taken during a predetermined period of time after the food waste disposer was determined to be grinding is not less than the grind check phase shift threshold.

In an aspect, the grind check phase shift threshold is a predetermined value programmed in the controller.

In an aspect, the controller is configured to determine the grind check phase shift threshold with a user initiated calibration routine. Upon a user initiating the calibration routine, the controller turns the motor of the food waste disposer on and after expiration of the start-up period, the controller records a second predetermined number of consecutively read phase shift readings. The controller calculates an average of the second predetermined number of consecutively read phase shift readings and sets the grind check phase shift threshold to this average minus a predetermined amount. In an aspect, the second predetermined number is ten.

In an aspect, the controller is configured to determine the grind check phase shift threshold with a self-calibration routine.

In an aspect, the self-calibration routine includes the controller recording a highest phase shift reading during a food waste disposer run cycle and setting the grind check phase shift threshold to be this recorded highest phase shift reading minus a predetermined amount. In an aspect, the predetermined amount is one degree.

In an aspect, the self-calibration routine includes after the start-up period, the controller configured to keep a rolling average of a third predetermined number of consecutive phase shift readings that the controller updates each time a new phase shift reading is taken and then sets the grind check phase shift threshold to be this rolling average minus a predetermined amount. In an aspect, the predetermined amount is one degree. In an aspect, the third predetermined number is 128.

In an aspect, the first predetermined number is five.

In an aspect, the status of operation includes whether the food waste disposer is jammed. In this aspect, the controller is further configured to determine that the food waste disposer is jammed when a jam check phase shift parameter is less than a jam check phase shift threshold. In an aspect, the jam check phase shift threshold is forty-five degrees.

In an aspect, the controller is configured to determine the jam check phase shift parameter by keeping a rolling average of a third predetermined number of consecutive phase shift readings that the controller updates each time a new phase shift reading is taken and setting the jam check phase shift parameter to the rolling average.

In an aspect, the controller is configured to determine that the jam check phase shift parameter is below the jam check phase shift threshold when a jam check number of consecutive most recently read phase shift readings are all below the jam check phase shift threshold.

In an aspect, the control unit is configured to control electrical power to two outlets wherein one of the outlets is for the food waste disposer and the other outlet is for an instant hot water tank having a resistive heater. The controller is configured to determine whether the instant hot water tank is plugged into the outlet for the food waste disposer when power to the outlet for the food waste disposer is on when a most recently read phase shift is less than a fourth predetermined amount or greater than a fifth predetermined amount and also configured to determine that the food waste disposer is plugged into the outlet for the instant hot water tank when power to the hot water tank receptacle is turned on when the most recently read phase shift reading is at least a sixth predetermined amount.

In an aspect, the control unit is configured to illuminate a visual indicator indicative of the food waste disposer grinding when the controller determines that the food waste disposer is grinding, a visual indicator indicative of the food waste disposer being jammed when the controller determines that the food waste disposer is jammed and a visual indicator indicative of an improper device being plugged into the outlet for the food waste disposer or the outlet for the instant hot water tank when the controller determines that the food waste disposer was plugged into the outlet for the hot water tank or the controller determines that the instant hot water tank was plugged into the outlet for the food waste disposer.

BRIEF DESCRIPTION OF THE DRAWINGS

Other objects and advantages of the invention will become apparent upon reading the following detailed description and upon reference to the drawings in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention.

DETAILED DESCRIPTION

Figure 2:
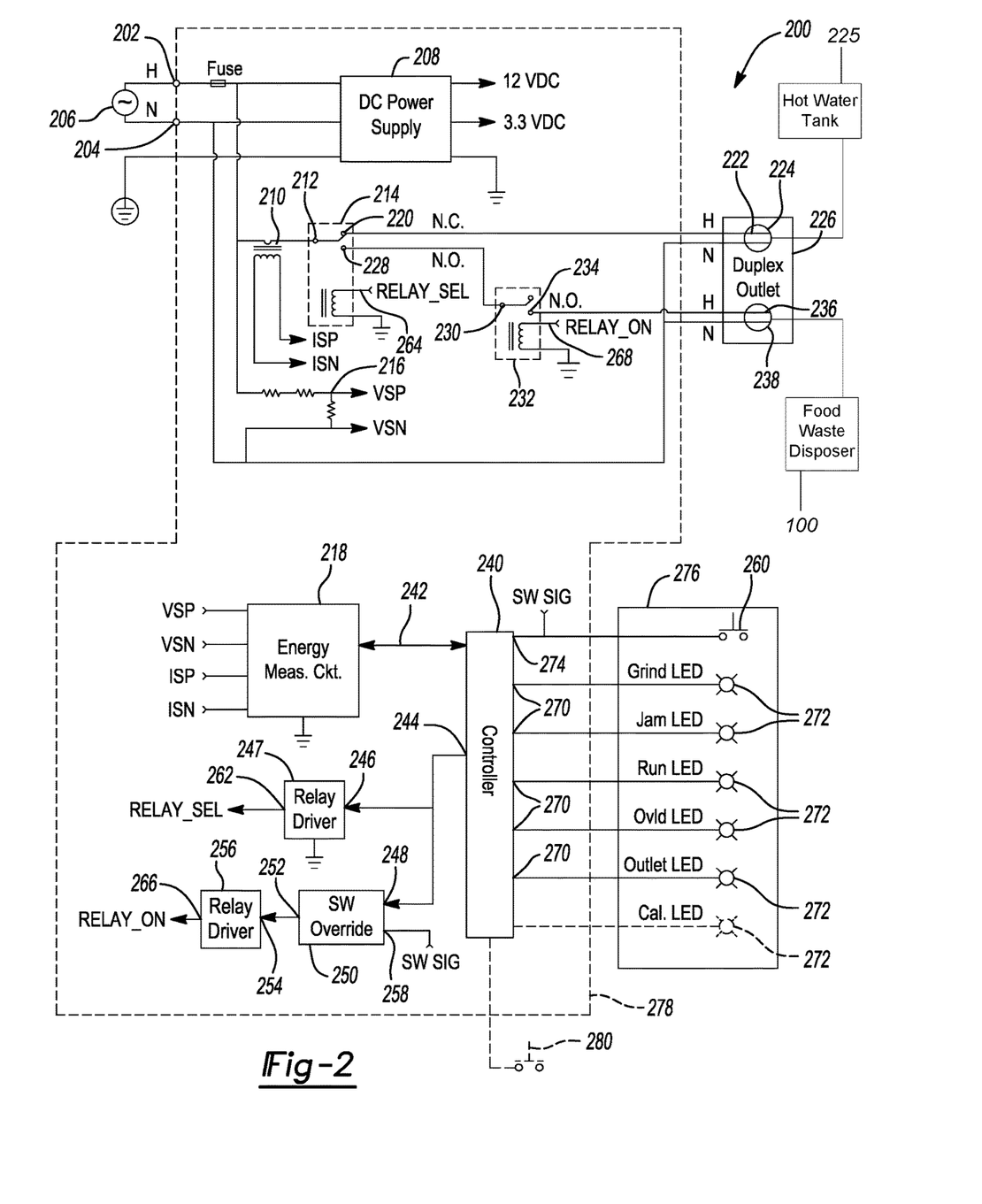
FIG. 2 is a block diagram of a control unit for a food waste disposer having an induction motor where the control unit uses phase shift readings to determine motor load in accordance with an aspect of the present disclosure.

FIG. 2 is a block diagram of a control unit 200 for monitoring operational status of a food waste disposer having an induction motor, such as food waste disposer 100 where motor 34 is an induction motor, using phase difference between voltage and current of alternating current power powering the induction motor of the food waste disposer in accordance with an aspect of the present disclosure. As used herein, "AC" is alternating current, "DC" is direct current, "VAC" is volts AC, "VDC" is volts DC. Control unit 200 has AC power inputs 202, 204 coupled to an AC power source 206, with input 202 a hot side input 202 couplable to a hot side of AC power source 206 and input 204 a common side input 204 couplable to a neutral side of AC power source 206, which may illustratively be a 120 VAC power source in countries where 120 VAC is the standard voltage for household power or a 240 VAC power source in countries where 240 VAC is the standard for household power. Control unit 200 includes a DC power supply 208, coupled to AC power inputs 202, 204, that provides DC power for control unit 200, illustratively 12 VDC and 3.3 VDC. Hot side input 202 is coupled through a current sense transformer 210 to a common contact 212 of a relay 214, referred to herein as outlet select relay 214, and is also coupled to a high impedance voltage divider 216 which provides via outputs VSP and VSN a voltage signal corresponding to the voltage of the AC power to an electrical energy measuring circuit 218. Electrical energy measurement circuit is illustratively an ADE7953 Single-Phase, Multifunction Metering Integrated Circuit available from Analog Devices of Norwood, Mass. Current sense transformer 210 provides via outputs ISP and ISN a current signal corresponding to the current of the AC power to electrical energy measuring circuit 218.

A normally closed contact 220 of outlet select relay 214 is coupled to a hot side 222 of an outlet 224 of a duplex electrical outlet 226. A normally open contact 228 of outlet select relay 214 is coupled to a common contact 230 of a relay 232, referred to herein as food waste disposer power relay 232. A normally open contact 234 of food waste disposer power relay 232 is coupled to a hot side 236 of an outlet 238 of duplex electrical outlet 226.

Outlet 224 is for an instant hot water tank 225 that has a resistive heater, which would be plugged into outlet 224, and may be referred to herein as instant hot water tank outlet 224. Outlet 238 is for the food waste disposer having the induction motor, which would be plugged into outlet 238, and may be referred to herein as food waste disposer outlet 238. When outlet select relay 214 is de-energized, AC power is provided to instant hot water tank outlet 224 and not to common contact 230 of food waste disposer power relay 232. When outlet select relay 214 is energized, AC power is provided to common contact 230 of food waste disposer power relay 232 and not to instant hot water tank outlet 224. When food waste disposer power relay 232 is energized and AC power has been provided to common contact 230 of food waste disposer power relay 232, AC power is provided to food waste disposer outlet 238.

Electrical energy measuring circuit 218 communicates with a controller 240 via a data communications bus 242. Controller 240 has an output 244 coupled to an input 246 of a relay driver 247 and to an input 248 of a switch override circuit 250. Switch override circuit 250 has an output 252 coupled to an input 254 of a relay driver 256. A second input 258 of switch override circuit 250 receives a switch on/off signal SW SIG indicative of whether an on/off button 260 has been pushed. An output 262 of relay driver 247 is coupled to a drive input 264 of outlet select relay 214, which may be a coil if outlet select relay 214 is an electro-mechanical relay or may be a solid-state drive input if outlet select relay 214 is a solid-state relay. An output 266 of relay driver 256 is coupled to a drive input 268 of food waste disposer power relay 232, which may be a coil if food waste disposer power relay 232 is an electro-mechanical relay or may be a solid-state drive input if food waste disposer power relay 232 is a solid-state relay.

Controller 240 also has a plurality of outputs 270 that drive respective ones of visual indicators 272, such as light emitting diodes ("LEDs") discussed in more detail below. Controller 240 also has an input 274 that receives the switch on/off signal SW SIG. Control unit 200 illustratively includes an enclosure 278 in which DC power supply 208, current sense transformer 210, relay 214, relay 232, electrical energy measuring circuit 218, controller 240, relay driver 247, switch override circuit 250 and relay driver 256 are disposed. Enclosure 278 may illustratively be disposed under the sink to which the food waste disposer is mounted, such as mounted to a wall of a sink cabinet for the sink. On/off button 260 and visual indicators 272 are illustratively disposed in a panel 276, on an electronic sinktop switch LED ring or single LED "dot" that is illustratively mounted on a countertop surrounding a sink to which the food waste disposer is installed, on a wall adjacent the sink or on sink flange mounted LEDs. Duplex electrical outlet 226 may also be disposed under the sink to which the food waste disposer is mounted, such as mounted to a wall of the sink cabinet.

When power to the control unit 200 is first turned on, such as plugging control unit 200 into a wall outlet, controller 240 executes a lamp test for visual indicators 272, referred to hereinafter as LED Lamp Test. This LED Lamp Test performs turns each of the visual indicators 272 on and off in sequence, illuminating each visual indicator for a predetermined period of time, such as 1 second. It should be understood that this predetermined period of time can be other than 1 second and is set to be sufficiently long to allow a user to observe whether the LED is working properly. After the LED Lamp Test, all the visual indicators are off, power is connected to the instant hot water tank outlet 224 and power is not connected to the food waste disposer outlet 238.

When power to control unit 200 is on, the phase shift the phase shift between the motor voltage and motor current is read every half cycle of line frequency. This phase shift is determined by electrical energy measuring circuit 218 and communicated to controller 240.

Figure 3:
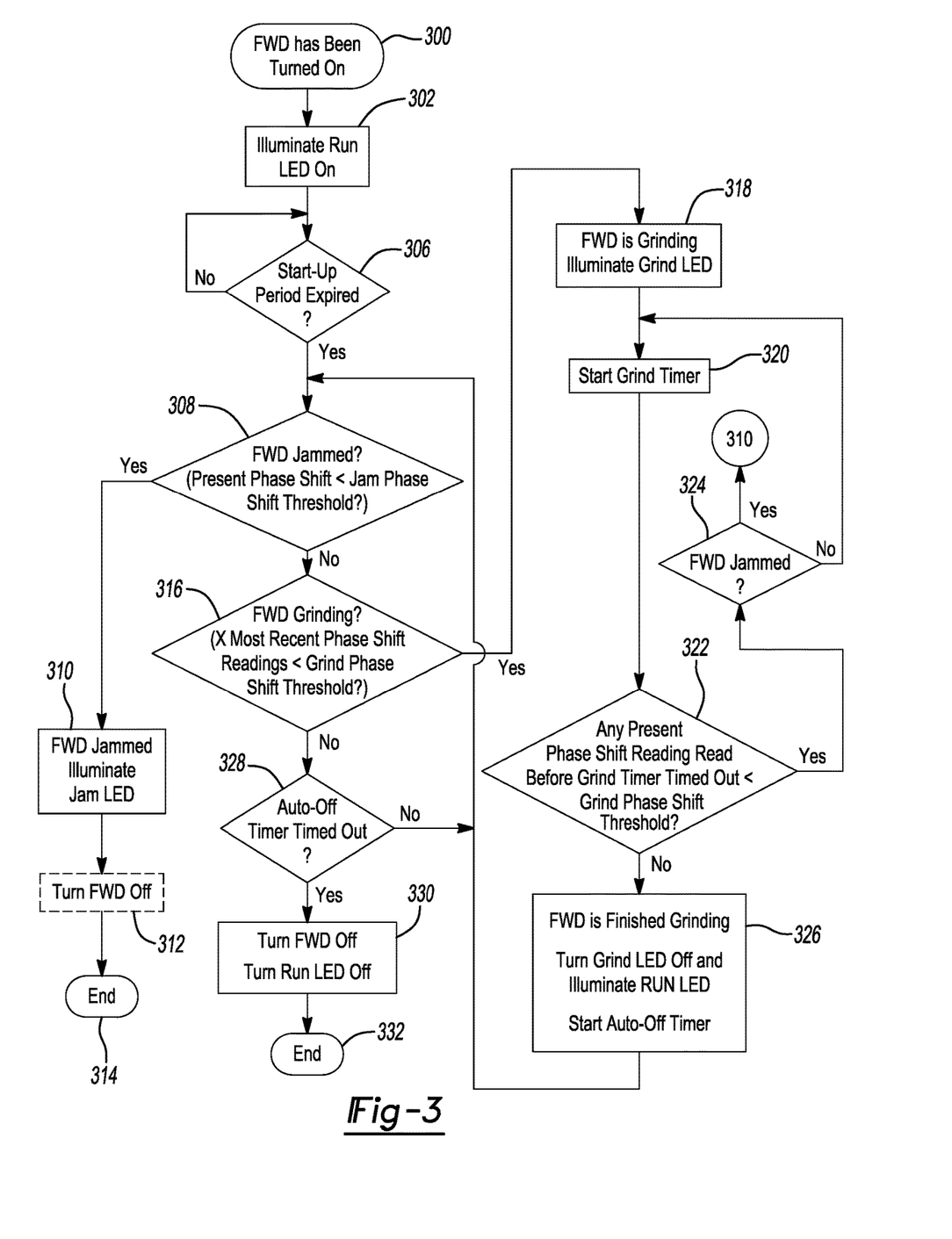
FIG. 3 is a flow chart of control logic for a control routine for the control unit of FIG. 2 that uses phase shift readings to determine status of the food waste disposer in accordance with an aspect of the present disclosure.

FIG. 3 is a flow chart of control logic of a control routine that determines motor loading using phase differences between motor voltage and motor current and uses the determined motor loading to determine status of operation of the food waste disposer, such as food waste disposer 100. In FIG. 3, food waste disposer is abbreviated as "FWD." The phase difference between motor voltage and motor current is referred to hereinafter after as phase shift. The control routine starts at 300 when AC power to the food waste disposer has been turned on. At 302, one of the visual indicators 272 that is used to indicate that the food waste disposer is running is illuminated, for example, the visual indicator 272 that is identified as the Run LED in FIG. 2 which may for example be a green LED. At 306, the phase shifts that were read during a start-up period immediately after the food waste disposer is turned on are ignored. This is due to the very small phase shift that occurs under startup conditions. It should be understood that the start-up period is a short period of time that it takes for the food waste disposer to reach steady state operation at no-load. For example, for the motor of the food waste disposer to reach stead state operation at its nominal no-load speed, typically 1800 RPM. An example start-up period is 1.5 seconds.

After the start-up period expires, the control routine proceeds to 308 where it checks whether the food waste disposer is jammed. It does so by checking whether a jam phase shift parameter is less than a jam check phase shift threshold and determines that the food waste disposer is jammed when the jam phase shift parameter is less than the jam check phase shift threshold. If the food waste disposer is jammed, the control routine proceeds to 310 where it illuminates one of the visual indicators 272 that is used to indicate that the food waste disposer is jammed, for example the visual indicator 272 that is identified as Jam LED in FIG. 2, which may for example be a red LED. In an aspect, it also turns power to the food waste disposer outlet 238 off, as shown in phantom at 312. It then ends at 314. If at 308 the control routine determined that the food waste disposer was not jammed, it proceeds to 316. It should be understood that in an aspect the control routine does not include block 312 and power to the food waste disposer outlet 238 is left on when the control routine determines that the food waste disposer is jammed and is then turned off when the thermal overload of the food waste disposer trips. It should be understood that in a variation, the control routine does not include checking whether the food waste disposer is jammed and associated steps (that is, does not include blocks 308, 310, 312 and 314).

The jam check phase shift threshold is illustratively 45 degrees, but it should be understood that it could be other than 45 degrees and may be determined heuristically. In an aspect, the jam phase shift parameter is a rolling average of phase shift readings determined in the same manner as the rolling average is determined in the control routine of FIG. 6. In an aspect, the jam phase shift parameter is determined to be below the jam check phase shift threshold when a predetermined number of consecutive rolling averages are below the jam check phase shift threshold, with this predetermined number referred to herein as the jam check number. In an aspect, the jam shift parameter is determined to be below the jam check phase shift number when a predetermined number of consecutive most recently read phase shift readings are all below the jam check phase shift threshold. In an aspect, this predetermined number in each may illustratively be six, but it should be understood that it could be other than six and may be determined heuristically.

At 316, the control routine checks whether the food waste disposer is grinding. It does so by checking whether a predetermined number of consecutive most recently read phase shift readings, referred to herein as a grind check number, are less than a grind check phase shift threshold. If the grind check number of consecutive most recently read phase shift readings are all below the grind check phase shift threshold, the food waste disposer is determined to be grinding. If the food waste disposer is determined to be grinding, the control routine proceeds to 318 where one of the visual indicators 272 that is used to indicate that the food waste disposer is grinding is illuminated, for example, the visual indicator 272 that is identified as the Grind LED in FIG. 2 which may for example be a blue LED. In an aspect the Grind LED is turned on and off when it is illuminated. That is, the visual indicator changes from Run LED to Grind LED and Grind LED to Run LED as the load changes. The control routine then proceeds to 320.

The grind check number and the grind check phase shift threshold are based on the level of noise and interference in control unit 200, such as on the AC line power, and the accuracy of determining grinding versus not grinding. The grind check number is illustratively 5 but it should be understood that it can be other than 5 and may be determined heuristically. The grind check phase shift threshold is determined as discussed below.

At 320, a grind timer is started and times for a predetermined period of time, such as 5 seconds, referred to herein as a grind indicator time period, regardless of whether the food waste disposer is still actually grinding food waste or not at any point before the grind timer times out. The grind indicator time period is a minimum time period that the Grind LED is illuminated once the food waste disposer is determined to be grinding. It should be understood that the grind indicator time period can be other than 5 seconds, which may be determined heuristically based on how long it is desired to having the Grind LED illuminated and whether the grind chamber of the food waste disposer has been sufficiently cleared out when the Grind LED is turned off and the Run LED is turned back on as discussed below. At 322 the control routine checks whether any present phase shift reading taken before the grind timer times out is below the grind phase shift threshold. If so, the control routine proceeds to 324 where it checks whether the food waste disposer is jammed by again checking whether the jam phase shift parameter is less than the jam phase shift threshold and determines that the food waste disposer is jammed when the jam phase shift parameter is less than the jam phase shift threshold. If the food waste disposer is jammed, the control routine branches to 310. If at 324 the food waste disposer was determined not to be jammed, the control routine proceeds back to 320 and restarts the grind timer. If the grind timer times out without any present phase shift reading read before the grind timer times out not being below grind phase shift threshold, the control routine determines at 322 that the food waste disposer has finished grinding and proceeds to 326. At 326, the control turns the Grind LED off and the Run LED back on, indicating that the food waste disposer has completed a grind cycle but is still running and starts an auto-off timer. The control routine then branches back to 308.

If at 316 it was determined that the food waste disposer was not grinding, the control routine branches to 328 where it checks whether the auto-off timer has timed out. If it hasn't, the control routine branches back to 308.

If at 328 the auto-off timer has timed out, the control routine proceeds to 330 where it turns the food waste disposer off by de-energizing food waste disposer power relay 232, and also by de-energizing outlet select relay 214, and also turns the Run LED off. The control routine then ends at 332 and repeats the next time power to the food waste disposer is turned on. The auto-off time period may for example be 25 seconds, but it should be understood that this time period can be other than 25 seconds and which may be determined heuristically.

The grind check phase shift threshold may simply be a predetermined value programmed into control unit 200 that is sufficiently below the phase shift when the food waste disposer is running under no-load conditions that phase shift readings below it are indicative of the food waste disposer grinding. As an example, the phase shift at no load may be 71 degrees and the grind check phase shift threshold then set at 70 degrees (one degree below the phase shift at no load). The grind check phase shift threshold may thus be determined heuristically as discussed above.

One difficulty presented by the foregoing is that induction motors having different horsepowers are used in food waste disposers and there are variations among food waste disposers having induction motors having the same nominal horsepower. In an aspect, one way to address this is to calibrate each food waste disposer during manufacture or installation to determine baseline values for the phase differences for that food waste disposer that are then used in the determination of motor loading. The grind check phase shift threshold is thus determined by calibrating each food waste disposer during manufacture or installation.

However, if the calibration during manufacture or installation is not performed properly, the determination of motor load would then not function properly. In an aspect, instead of calibrating the food waste disposer during manufacture or installation, control unit 200 includes a calibration routine that is used to determine the grind check phase shift threshold, as discussed below. The calibration routine may be a user initiated calibration routine or a self-calibration routine that is automatically run by control unit 200.

Figure 4:
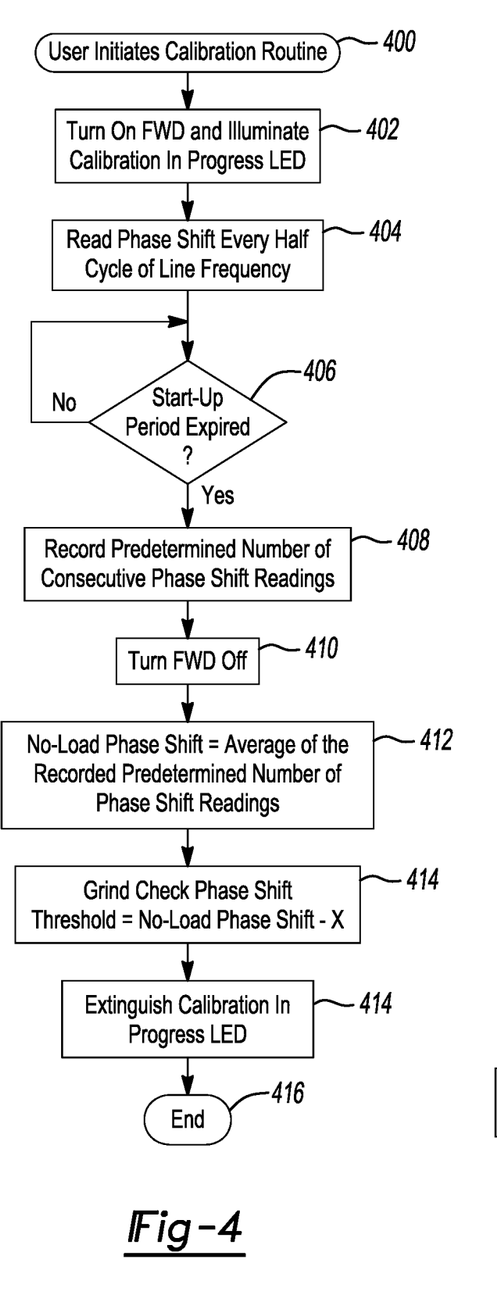
FIG. 4 is a flow chart of control logic for a control routine for the control unit of FIG. 2 for a user initiated calibration routine to determine a grind check phase shift threshold in accordance with an aspect of the present disclosure.

FIG. 4 is a flow chart for an example of control logic for a control routine for a user initiated calibration routine. This control routine starts at 400 when a user initiates the calibration routine, such as by pressing a calibration button 280 (FIG. 2). The control routine proceeds to 402 where it turns the food waste disposer on and illuminates a visual indicator 272 that indicates that the calibration is in progress, for example, the visual indicator 272 that is identified as the CAL LED in FIG. 2 which may for example be an orange LED. It should be understood that if control unit 200 does not include a user initiated calibration routine such as the calibration routine of FIG. 4, then calibration button 280 and the CAL LED are not present and they are thus shown in phantom in FIG. 2.

Once the food waste disposer is running, at 404 the phase shift between the motor voltage and motor current is read every half cycle of line frequency. At 406, the phase shifts during the start-up period (described above) immediately after the food waste disposer is turned on are ignored. After the start-up period expires, the control routine proceeds to 408 where it records a pre-determined number of consecutive phase shift readings, which may for example be ten consecutive phase shift readings but can be other than ten. This pre-determined number is a sufficient number of phase shift readings to provide an accurate indication of phase shift at no-load when they are averaged, as discussed below, and may for example be determined heuristically. The control routine then proceeds to 410 where it turns the food waste disposer off and then proceeds to 412 where it determines a no-load phase shift by averaging the recorded predetermined number of consecutive phase shift readings. The control routine then proceeds to 414 where it determines a grind check phase shift threshold by subtracting a predetermined amount from the no-load phase shift, such as one degree. It should be understood that this predetermined amount can be other than one degree and is a large enough amount so that a phase shift reading that is below the grind check phase shift threshold is indicative that the food waste disposer is grinding. It may for example be determined heuristically. The control routine then proceeds to 416 where it extinguishes the CAL LED and ends at 418. It should be understood that the control routine may need to be periodically rerun due to motor wear over time. In an aspect, control unit 200 thus periodically prompts the user to rerun the calibration routine.

Figure 5:
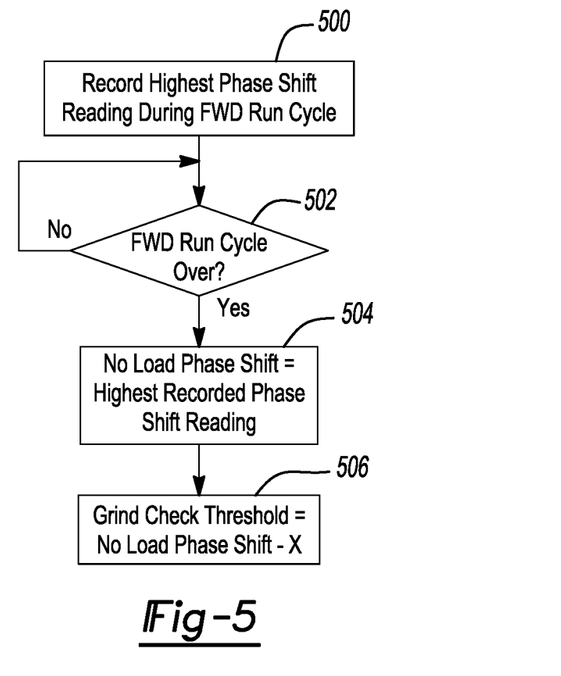
FIG. 5 is a flow chart for an example of control logic for a control routine for the control unit of FIG. 2 for a self-calibration routine that uses a highest phase shift read during a FWD run cycle to determine a grind check phase shift threshold in accordance with an aspect of the present disclosure.

FIG. 5 is a flow chart for an example of control logic for a control routine for a self-calibration routine that uses a highest phase shift read during a FWD run cycle to determine the grind check phase shift threshold. As used herein, a FWD run cycle is the period from when the FWD is turned on until it is turned off. The control routine of FIG. 5 starts each time the food waste disposer is turned on and thus starts at 300 (FIG. 3) and is run with the control routine of FIG. 3. At 500, the control routine records the highest phase shift reading during the FWD run cycle. Upon determining at 502 that the FWD run cycle is over, the control routine proceeds to 504 where it sets a no-load phase shift to the highest recorded phase shift reading and proceeds to 506. At 506, the control routine determines a grind check phase shift threshold by subtracting a predetermined amount (indicated as "X" in FIG. 5) from the no-load phase shift, in the same manner as discussed above with reference to FIG. 4, such as one degree. This grind check phase shift threshold is then used by the control routine of FIG. 3 as the grind check phase shift threshold in block 316 the next time the food waste disposer is started running. It should be understood that the highest recorded phase shift recorded during each run cycle can be used for the no-load phase shift to determine the grind check phase shift threshold to be used by the control routine of FIG. 3 the next time food waste disposer is started running. There would then be a preloaded phase shift value that is used for the no-load phase shift for the first run cycle.

Figure 6:
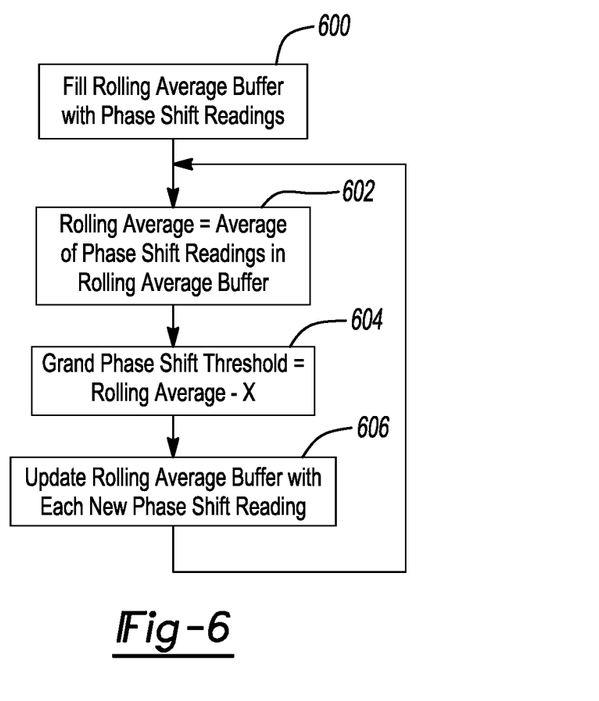
FIG. 6 is a flow chart for an example of control logic for a control routine for the control unit of FIG. 2 for a self-calibration routine that uses a rolling average of phase shift readings to determine a grind check phase shift threshold in accordance with an aspect of the present disclosure.

FIG. 6 is a flow chart for control logic for a control routine for another self-calibration routine that uses a rolling average of phase shift readings to determine the grind check phase shift threshold. This self-calibration routine illustratively runs as part of the control routine of FIG. 3. After the start-up period expires, at 600 a rolling average buffer such as in controller 240 comprised of 128 positions is filled with the phase shift readings taken every half cycle of line frequency cycle. It should be understood that the rolling average buffer can have other than 128 positions but must have a sufficient number of positions for the self-calibration which may be determined heuristically. Once the rolling average buffer is filled, at 602 all the phase shift readings in the rolling average buffer are averaged with this average referred to herein as a rolling average. The control routine then proceeds to 604 where it determines a grind check phase shift threshold by subtracting a predetermined amount (indicated as "X" in FIG. 6) from the rolling average. At 606, the rolling average is updated each time another phase shift reading is taken, referred to herein as the present phase shift reading, by deleting the oldest phase shift reading, shifting the remaining phase shift readings down one position in the rolling average buffer, and adding the present phase shift reading to the rolling average buffer. The control routine then branches back to 602 where the rolling average is updated by recalculating it and then proceeds to 604 where it redetermines the grind check phase shift value using the updated rolling average. This grind check phase shift threshold is then used as the grind check phase shift threshold in block 316.

In an aspect, duplex electrical outlet 226 including instant hot water tank outlet 224 and food waste disposer outlet 238 are fed by the same electrical circuit from a single house circuit breaker rated as 15 amps or 20 amps and control unit 200 controls power to outlets 224, 238. When the on/off button is pushed, control unit 200 automatically switches power off to the instant hot water tank outlet 224 via outlet select relay 214 and switches power on to food waste disposer outlet 238 via outlet select relay 214 and food waste disposer power relay 232. If the on/off button 260 is pressed again, the power is switched off to the food waste disposer outlet 238 via outlet select relay and on to the instant hot water tank outlet 224 via the outlet select relay 214. For this to function properly the food waste disposer must be connected to the food waste disposer outlet 238 and the instant hot water tank must be connected to the instant hot water tank outlet.

Figure 7:
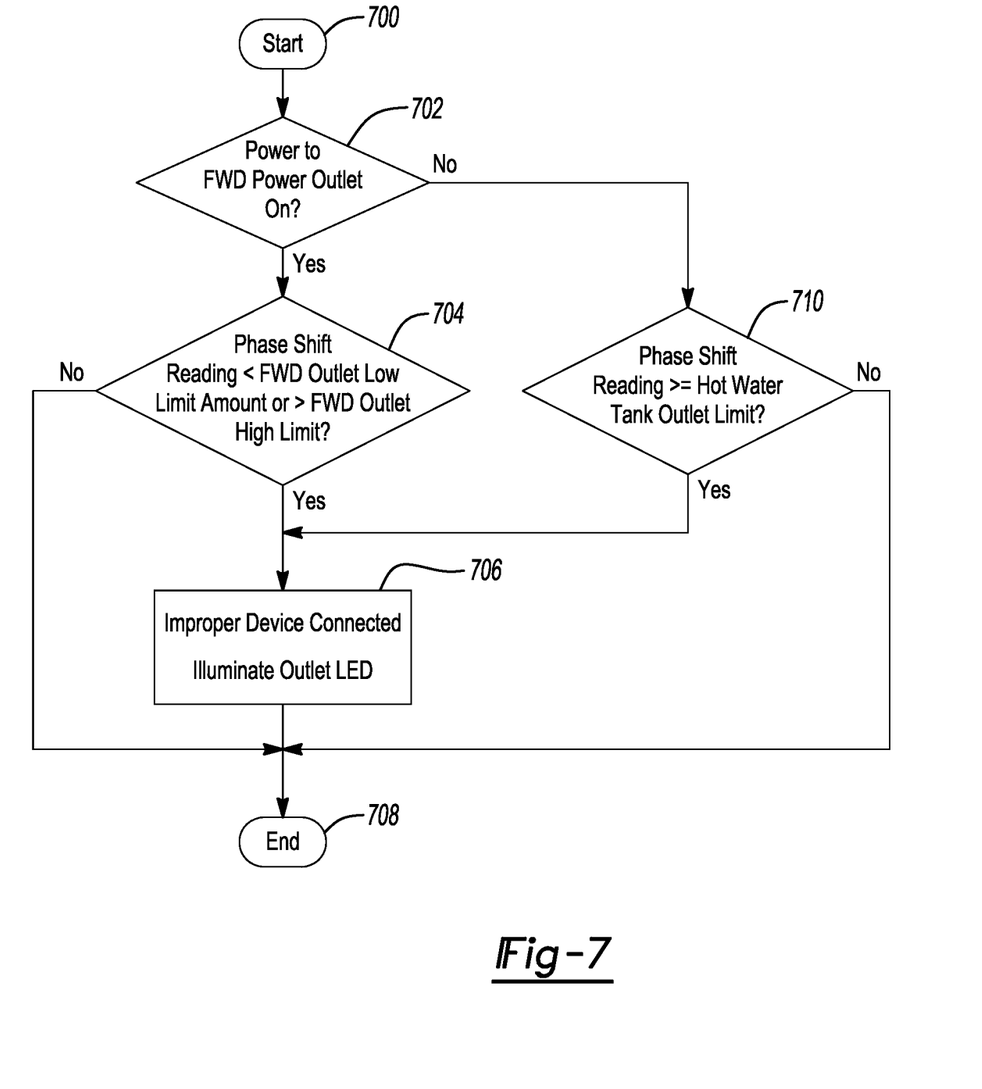
FIG. 7 is a flow chart of control logic for a control routine for the control unit of FIG. 2 that uses phase shift readings to determine if the food waste disposer is plugged into an outlet for a hot water tank or a hot water tank is plugged into an outlet for the food waste disposer in accordance with an aspect of the present disclosure.

In an aspect, control unit 200 alerts a user if the food waste disposer or the instant hot water tank is plugged into the wrong outlet of duplex electrical outlet 226. FIG. 7 is a flow chart of control logic for a control routine for determining if a food waste disposer or the instant hot water tank is plugged into the wrong outlet of duplex electrical outlet 226 and is a parallel control routine to the control routine of FIG. 3. The control routine starts at 700 and proceeds to 702 where it checks whether power to the food waste disposer outlet 238 has been turned on. If so, the control routine proceeds to 704 where it takes a phase shift reading (phase difference between line voltage and line current of the AC power at AC power inputs 202, 204 of control unit 200) and uses this phase shift reading to determine if a device connected to food waste disposer outlet 238 is a device having an induction motor such as a food waste disposer. It does so by checking whether this phase shift reading is less than a food waste disposer outlet low limit, illustratively 10 degrees (but can be other than 10 degrees and may be determined heuristically), or greater than a food waste disposer outlet high limit, illustratively 90 degrees (but can be other than 90 degrees and may be determined heuristically). If this phase shift reading is less than the food waste disposer outlet low limit or greater than food waste disposer high limit, then the control routine determines that whatever is connected to the food waste disposer outlet 238 is not a device having an induction motor, such as it is not a food waste disposer having an induction motor, and then proceeds to 706. At 706, the control routine illuminates one of visual indicators 272 that is used to indicate that the device connected to one of the outlets 224, 238 is improper, such as the visual indicator 272 identified as Outlet LED in FIG. 2 which may be a magenta LED. It then proceeds to end at 708. If at 704 the present phase shift reading was equal to or greater than the food waste disposer outlet low limit and equal to or less than the food waste disposer high limit, the control routine determines that the device connected to food waste disposer outlet 238 is proper and proceeds to end at 708.

If at 702 power to the food waste disposer outlet 238 had not been turned on, the control routine proceeds to 710 where it checks whether a device that has an induction motor is plugged into instant hot water tank outlet 224. It does so by taking a phase shift reading and checking whether this phase shift reading is at least a hot water tank outlet limit, illustratively 45 degrees (but can be other than 45 degrees and may be determined heuristically). If the present phase shift reading is at least the hot water tank outlet limit, then whatever is connected to the instant hot water tank outlet 224 has an induction motor and is thus not an instant hot water tank. The control routine then branches to 706. If at 710 the present phase shift reading was not at least the hot water tank limit, the control routine branches to 708.

In an aspect, motor current magnitude (which is a magnitude of current being drawn by the motor of the food waste disposer) is monitored by controller 240 using current sense transformer 210. In an aspect, a control routine uses the motor current magnitude to determine if the food waste disposer has tripped its overload. Controller 240 checks whether motor current magnitude of less than a predetermined amount referred to herein as overload check amount is detected. If the motor current is less than the overload check amount, either the food waste disposer has tripped its thermal overload or the food waste disposer is not plugged into the food waste disposer outlet 238. Controller 240 then illuminates a visual indicator 272 that is used to indicate that the food waste disposer has tripped its thermal overload, for example the visual indicator 272 that is identified as Ovid. LED in FIG. 2, which may for example be a yellow LED. Controller 240 also turns power off to the food waste disposer outlet 238. The overload check amount may be for example one amp, but it should be understood that it can be other than one amp and may be determined heuristically.

In aspect, an internal temperature of control unit 200 is monitored using an active thermistor integrated circuit. The output of this device connects to controller 240, which performs the temperature monitoring. If the internal temperature of the control unit exceeds 80° C., one of the visual indicators 272 such as the Jam LED is illuminated with a flashing pattern and the controller 240 will remove power from the food waste disposer outlet 238 and apply power to the instant hot water tank outlet 224 until the temperature of the control unit reduces to less than 70° C. It should be understood that these temperature thresholds can be other than 80° C./70° C., respectively, and may be determined heuristically.

In an aspect, the control unit 200 includes the ability to disable the auto-off functionality discussed above. There may be a case where the user wants the food waste disposer to keep running longer without repeatedly pressing the on/off button or a case where the auto-off isn't working quite right with that user's food waste disposer. To disable the auto-off functionality, the user disconnects and then reconnects power to the control unit 200, such as unplugging it and then plugging back into a wall outlet, presses and holds down the on/off button 260 during the LED Lamp Test for a minimum of 5 seconds (but which can be other than 5 seconds and which may be determined heuristically). The user can hold down the on/off button 260 as long as they like beyond 5 seconds, but when they release it, one of the visual indicators 272 (such as the Grind LED) is illuminated by controller 240 for 3 seconds (but which can be other than 3 seconds and which may be determined heuristically) indicating the auto-off functionality is enabled, or another of the visual indicators 272 (such as the Run LED) is illuminated by controller 240 for 3 seconds indicating that the auto-off functionality is disabled. If the user fails to hold down the button for the minimum 5 seconds, another of the visual indicators (such as the Jam LED) is illuminated by controller 240 for 3 seconds (but which can be other than 3 seconds and which may be determined heuristically) indicating no change to the state of auto-off functionality was made. After the 3 second period, the visual indicator that was illuminated is turned off and the controller and restarts the LED Lamp Test. Note that the reason for the condition "unplug then plug back in the control unit 200 from the wall outlet" is to prevent the state of the auto-off functionality from being unintentionally changed during normal operation. If power to control unit 200 is lost and then restored, the previously set state of the auto-off functionality will remain set.

In an aspect, control unit 200 has the ability to "lockout" or prevent operation of the food waste disposer in case the user wants to prevent others from operating the food waste disposer for a period of time. If the user presses the on/off button 260 and holds it longer than 500 ms (which can be other than 500 ms and which may be determined heuristically), controller 240 starts a timer and determines the time the on/off button is held pressed. If this time exceeds one second (which can be other than one second and may be determined heuristically), controller 240 begins flashing one of the visual indicators 272 (such as the Run LED) at a 1 Hz rate (but which can be other than 1 Hz and which may be determined heuristically). If on/off button 260 remains pressed for a 5 second period (but which can be other than 5 seconds and which may be determined heuristically), controller 240 illuminates another of the visual indicators 272 (such as the Grind LED) for 3 seconds (but which can be other than 3 seconds and which may be determined heuristically) and then turns this visual indicator off and also turns power off to the food waste disposer outlet 238. Control unit 200 is now in a "lockout mode." While in this lockout mode, pressing on/off button will not turn power to the food waste disposer on, and controller 240 will flash one of the visual indicators 272 (such as the Grind LED) every 15 seconds (but which can be other than 15 seconds and which may be determined heuristically.

When control unit 200 is in the lockout mode, controller 240 only monitors the temperature of control unit 200, on/off button 260 and hot water tank outlet 224 to see if a food waste disposer is plugged into hot water tank outlet 224. If the on/off button 260 is again pressed for longer than 500 ms (but which may be other than 500 ms and which may be determined heuristically, controller 240 starts a timer to determine the time that the on/off switch is pressed. If the on/off switch is pressed for more than one second (which may be other than one second and which may be determined heuristically), controller 240 begins flashing one of visual indicators 272 (such as the Run LED) at a 1 Hz rate (but which may be other than 1 Hz and which may be determined heuristically). If the on/off button remains pressed for 5 seconds (which may be other than 5 seconds and which may be determined heuristically), controller 240 will change the flashing visual indicator 272 to non-flashing illumination for 3 seconds (which may be other than 3 seconds and which may be determined heuristically) and then turn it off and return control unit 200 to normal operating mode. In either case, if on/off button 260 remains pressed for more than one second (which may be other than one second and which may be determined heuristically) but less than 5 seconds (which may be other than 5 seconds and which may be determined heuristically), controller 240 will illuminate one of visual indicators 272 (such as the Jam LED) indicating that there was no change in the state of the lockout mode. This is similar to the auto-off enable/disable discussed above, except that it can occur only after the LED lamp test has completed.

In an aspect, controller 240 monitors and stores usage, operational and product development parameters. In an aspect, these parameters include: total number of activations of the food waste disposer, total run time of the food waste disposer, number of jams of the food waste disposer, number of auto-off occurrences, number of thermal overload trips and open circuits, number of times an improper device is plugged into an outlet 224 and number of times an improper device is plugged into outlet 238, number of instant hot water tank overcurrent occurrences, number of auto-off disables and enables, number of auto-off change failures, number of over-temperature occurrences of control unit 200, last auto-off state, minimum/maximum AC line voltages, maximum start-up current, maximum jam current, maximum temperature of control unit 200, and minimum/maximum phase angle. This data can then be retrieved from controller 240 as needed. This data may illustratively be used by way of example and not of limitation to evaluate failures, reassess warranty periods, and learn about actual usage patterns and to reevaluate marketing strategies.

It should be understood that controller 240 may be, be part of, or include an Application Specific Integrated Circuit (ASIC); an electronic circuit; a combinational logic circuit; a field programmable gate array (FPGA); a processor (shared, dedicated, or group) that executes code; a programmable logic controller, programmable control system such as a processor based control system including a computer based control system, a process controller such as a PID controller, a microcontroller, or other suitable hardware components that provide the described functionality or provide the above functionality when programmed with software as described herein; or a combination of some or all of the above, such as in a system-on-chip. The term module may include memory (shared, dedicated, or group) that stores code executed by the processor. The term software, as used herein, may refer to computer programs, routines, functions, classes, and/or objects and may include firmware, and/or microcode. When it is stated that controller unit 200 or controller 240 performs a function, it should be understood that controller 240 is configured to do so such as by appropriate software, electronic circuit(s) including discrete and integrated logic, or combination thereof.

The particular embodiments disclosed above are illustrative only, as the invention may be modified and practiced in different but equivalent manners apparent to those skilled in the art having the benefit of the teachings herein. It is therefore evident that the particular embodiments disclosed above may be altered or modified and all such variations are considered within the scope and spirit of the invention.

What is claimed is:

1. A method of operating a food waste disposer comprising:
   providing a food waster disposer comprising a motor, a controller programmed with control logic comprising an auto-off timer routine, and wherein the food waste disposer is powered by an alternating current electrical power source having a line frequency, a line voltage and a line current;
   powering ON the food waste disposer;
   after expiration of a start-up period and at regular intervals of the line frequency, determining a phase shift between the line voltage and the line current, communicating the phase shift to the controller, and comparing the phase shift to a grind check phase shift threshold;
   determining that the food waste disposer is grinding in response to each of a first predetermined number of consecutively determined phase shifts being below a grind check phase shift threshold;
   determining that the food waste disposer is not grinding in response to each of the first predetermined number of consecutively determined phase shifts being not below the grind check phase shift threshold;
   determining whether the auto-off timer routine has expired in response to determining that the food waste disposer is not grinding; and
   powering OFF the food waste disposer in response to determining that the auto-off timer routine has expired.

2. The method of claim 1 further including determining the grind check phase shift threshold with a calibration routine that includes, upon a user initiating the calibration routine, having the controller turn the motor of the food waste disposer ON, after expiration of the start-up period, having the controller record a second predetermined number of consecutively determined phase shifts, having the controller calculate an average of the second predetermined number of consecutively determined phase shifts and with the controller setting the grind check phase shift threshold to this average minus a predetermined amount.

3. The method of claim 2 wherein the first predetermined number of consecutively determined phase shifts is five and the second predetermined number of consecutively determined phase shifts is ten.

4. The method of claim 1 further including determining the grind check phase shift threshold with a self-calibration routine.

5. The method of claim 4 wherein determining the grind check phase shift threshold with the self-calibration routine includes recording a highest phase shift determined during a run cycle and setting with the controller the grind check phase shift threshold to be the highest phase shift minus a predetermined amount.

6. The method of claim 5 wherein the first predetermined number of consecutively determined phase shifts is five.

7. The method of claim 4 wherein determining the grind check phase shift threshold with the self-calibration routine includes, after the start-up period, keeping with the controller a rolling average of a third predetermined number of consecutively determined phase shifts that the controller updates each time a new phase shift is determined, and setting with the controller the grind check phase shift threshold to be the rolling average minus a predetermined amount.

8. The method of claim 7 wherein the first predetermined number of consecutively determined phase shifts is five and the third predetermined number of consecutively determined phase shifts is 128.

9. The method of claim 1 further comprising determining that the food waste disposer is jammed in response to determining whether a jam check phase shift parameter is less than a jam check phase shift threshold.

10. The method of claim 9 further comprising determining the jam check phase shift parameter by keeping a rolling average of a third predetermined number of consecutively determined phase shifts that the controller updates each time a new phase shift is determined and setting the jam check phase shift parameter to the rolling average.

11. The method of claim 10 wherein the jam check phase shift threshold is forty-five degrees.

12. The method of claim 9 including determining that the jam check phase shift parameter is below the jam check phase shift threshold when a jam check number of consecutive most recently determined phase shifts are all below the jam check phase shift threshold.

13. The method of claim 12 wherein the jam check phase shift threshold is forty-five degrees.

14. The method of claim 1 wherein the grind check phase shift threshold is a predetermined value programmed in the controller.

15. The method of claim 1 wherein a power outlet has two outlets wherein a first outlet is a food waste disposer outlet and a second outlet is an instant hot water tank outlet, the method further including:
   determining with the controller whether an instant hot water tank is plugged into the food waste disposer outlet when power to the food waste disposer outlet is ON when a most recently determined phase shift is less than a food waste disposer outlet low limit or greater than a food waste disposer high limit; and
   determining with the controller that the food waste disposer is plugged into the instant hot water tank outlet when power to the instant hot water tank outlet is ON when the most recently determined phase shift is at least a hot water tank outlet limit.

16. The method of claim 15 including illuminating with the controller a first visual indicator indicative of the food waste disposer grinding when the controller determines that the food waste disposer is grinding, a second visual indicator indicative of the food waste disposer being jammed when the controller determines that the food waste disposer is jammed and a third visual indicator indicative of an improper device being plugged into the food waste disposer outlet or the instant hot water tank outlet when the controller determines that the food waste disposer was plugged into the instant hot water tank outlet or the controller determines that the instant hot water tank was plugged into the food waste disposer outlet.

* * * * *

UNITED STATES PATENT AND TRADEMARK OFFICE
CERTIFICATE OF CORRECTION

| | |
|---|---|
| PATENT NO. | : 11,717,835 B2 |
| APPLICATION NO. | : 17/512096 |
| DATED | : August 8, 2023 |
| INVENTOR(S) | : Thomas R. Berger et al. |

It is certified that error appears in the above-identified patent and that said Letters Patent is hereby corrected as shown below:

On the Title Page

Column 2, References Cited, After "(Continued)", insert --¶OTHER PUBLICATIONS, International Search Report and Written Opinion of the ISA for PCT/US2019/060706, ISA/US, Alexandria, Virginia, dated Apr. 22, 2020.--

Signed and Sealed this
Twenty-fourth Day of October, 2023

*Katherine Kelly Vidal*

Katherine Kelly Vidal
*Director of the United States Patent and Trademark Office*